United States Patent [19]
Asada

[11] Patent Number: 5,654,659
[45] Date of Patent: Aug. 5, 1997

[54] SCAN CIRCUIT HAVING A REDUCED CLOCK SIGNAL DELAY

[75] Inventor: Hideki Asada, Tokyo, Japan

[73] Assignee: NEC Corporation, Tokyo, Japan

[21] Appl. No.: 395,859

[22] Filed: Feb. 28, 1995

[30]  Foreign Application Priority Data

Feb. 28, 1994 [JP] Japan .................................. 6-030658

[51] Int. Cl.$^6$ .............................. H03K 5/14; H03K 3/356
[52] U.S. Cl. ........................... 327/208; 327/295; 327/288; 327/161; 327/250; 377/79
[58] Field of Search ..................................... 327/199, 200, 327/202, 203, 263, 264, 269, 271, 272, 284, 285, 288, 295, 208–212, 225, 141, 154, 161, 241, 242, 250, 251; 377/78, 79

[56]  References Cited

U.S. PATENT DOCUMENTS

| | | | |
|---|---|---|---|
| 3,937,982 | 2/1976 | Nakajima | 307/205 |
| 4,443,765 | 4/1984 | Findeisen et al. | 327/277 |
| 4,694,197 | 9/1987 | Sprague | 327/288 |
| 4,794,276 | 12/1988 | Sasada et al. | 327/202 |
| 5,220,216 | 6/1993 | Woo | 327/278 |
| 5,239,206 | 8/1993 | Yanai | 327/379 |
| 5,463,337 | 10/1995 | Leonowich | 327/261 |

OTHER PUBLICATIONS

Kindaikagakusha, "Fundamental of MOS INtegrate Circuit", Japan, pp. 101–102, 1992. No month.

Yuan, et al., "High–Speed CMOS Circuit Technique", IEEE Journal of Solid State Citcuits, V24 N1, Feb. 1989, pp. 62–70.

Primary Examiner—Timothy P. Callahan
Assistant Examiner—Eunja Shin
Attorney, Agent, or Firm—Whitham, Curtis, Whitham & McGinn

[57]  ABSTRACT

A scan circuit includes a plurality of stages of cascaded pulse delay transfer circuits each including a single-phase-clock controlled inverter connected in cascade and configured to receive a given pulse signal from a preceding stage so as to transfer the received pulse signal to a next stage at a delayed timing in synchronism with a clock signal, and a two-input logic gate having a first input connected to an output of the associated single-phase-clock controlled inverter and a second input receiving the same clock signal. The two-input logic gate of an odd-numbered stage includes a NOR gate, which has an output connected to a non-inverting output buffer. The two-input logic gate of an even-numbered stage includes a NAND gate, which has an output connected to an inverting output buffer.

19 Claims, 11 Drawing Sheets

FIGURE 12

SCAN CIRCUIT HAVING A REDUCED CLOCK SIGNAL DELAY

BACKGROUND OF THE INVENTION

1. Field of the Invention

The present invention relates to a scan circuit for use in a peripheral driving circuit of a liquid crystal display, a close contact type image sensor, a liquid crystal shutter and the like.

2. Description of Related Art

For the purpose of manufacturing a liquid crystal display, a close contact type image sensor, a liquid crystal shutter, and fluorescent display tube in a small size, at a low cost and with high reliability, there is a technique of forming a thin film driving circuit integral with these devices. This is based on a conception in which if a peripheral driving circuit is provided on the same substrate as that on which pixel electrodes are provided, it is possible to greatly reduce the number of connection terminals and the number of external driving ICs (integrated circuits), and therefore, it is possible to solve a reliability problem caused by restriction in a bonding process for a large area and in a high density.

A scan circuit composed of a shift register and an output buffer, is used as a vertical driving circuit in an active matrix liquid crystal display, or as a circuit for scanning a sample hold switch in a horizontal driving circuit, and therefore, constitutes an important element in the thin film driving circuit.

Figure 1:
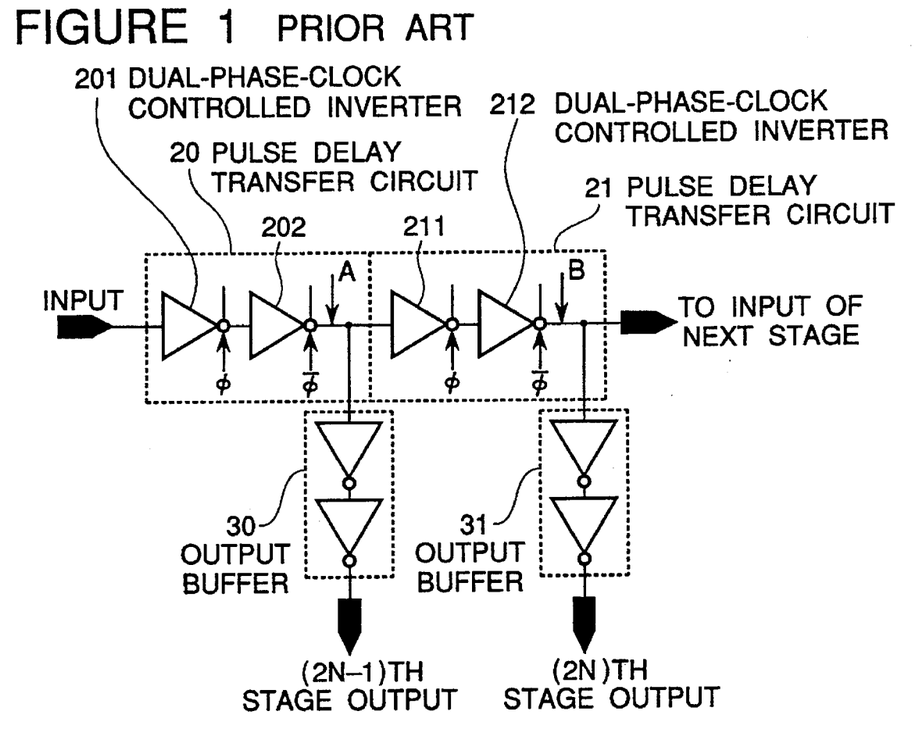
FIG. 1 is a block diagram of one example of a conventional scan circuit.

One example of the shift register used in such a scan circuit is described in "Fundamental of MOS Integrated Circuit", Pages 101–102, 1992, Kindaikagakusha (Japan). Referring to FIG. 1, there is illustrated a circuit construction of an essential circuit described in this book, but only (2N-1)th and (2N)th stages of the scan circuit are extracted and shown, although the scan circuit is formed by cascading stages of the predetermined number dependent upon the size of a display circuit to be driven.

The shown circuit includes shift registers 20 and 21 for transferring a pulse signal in a delayed timing in synchronism with a clock signal, and output buffers 30 and 31. The shown shift register 20 is formed by cascading two dual-phase-clock controlled CMOS inverters 201 and 202 which are respectively controlled by two clock signals $\phi$ and $\bar{\phi}$ complementary to each other. Similarly, the shift register 21 is formed of two cascaded clocked CMOS inverters 211 and 212.

Figure 2:
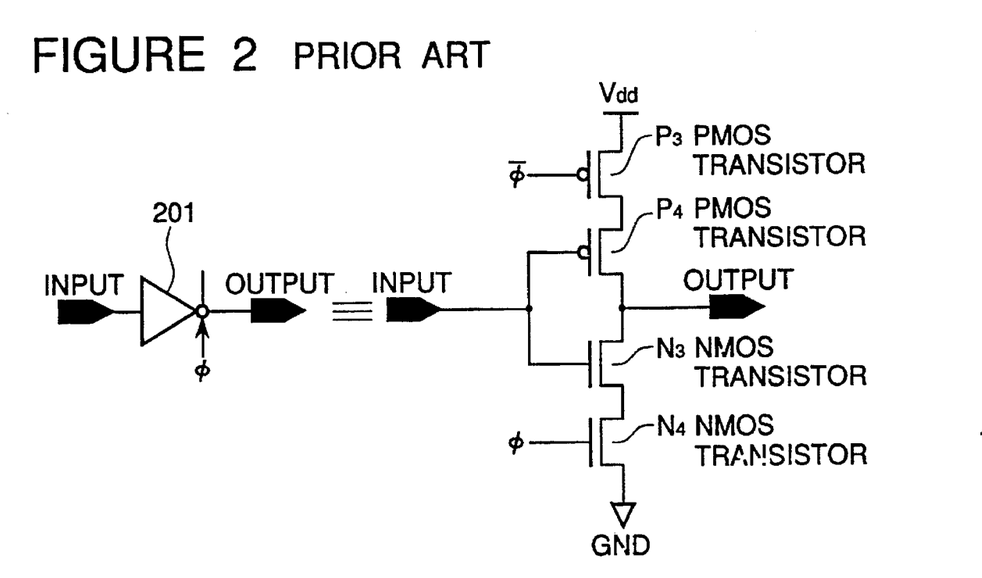
FIG. 2 is a circuit diagram of a dual-phase-clock controlled CMOS inverter used in the scan circuit shown in FIG. 1.

FIG. 2 shows a construction of a dual-phase-clock controlled CMOS inverter circuit 201. The dual-phase-clock controlled CMOS inverter circuit 201 is called a "clocked CMOS inverter", and is formed by cascading P-channel insulated-gate electric field transistors (called "PMOS transistor" hereinafter) P3 and P4 and N-channel insulated-gate electric field transistors (called "NMOS transistor" hereinafter) N3 and N4 between a voltage supply voltage Vdd and ground GND.

When the clock signal $\phi$ is a high level and the clock signal $\bar{\phi}$ is at a low level, the clocked CMOS inverter outputs an inverted signal of an input signal. To the contrary, when the clock signal $\phi$ is at a low level and the clock signal $\bar{\phi}$ is at a high level, an output of the clocked CMOS inverter becomes a high impedance.

Figure 3:
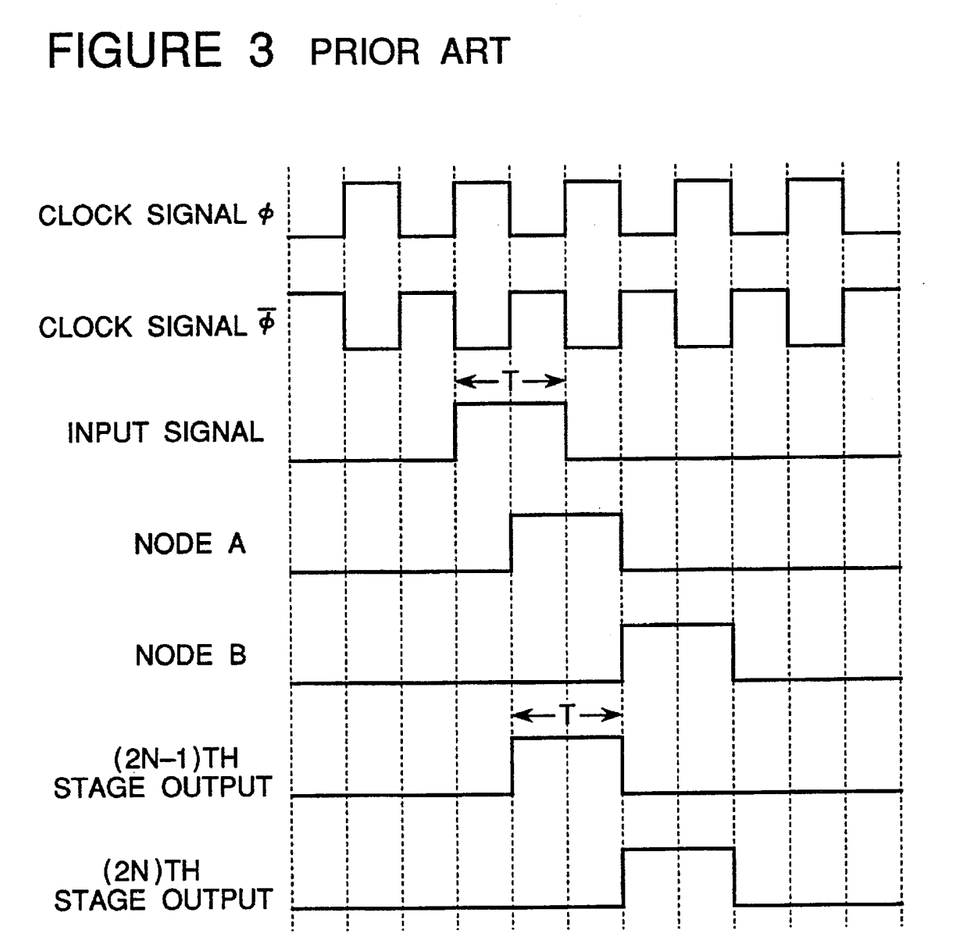
FIG. 3 is a timing chart illustrating an operation of the scan circuit shown in FIG. 1.

Referring to FIG. 3 which is a timing chart illustrating an operation of the conventional scan circuit shown in FIG. 1, this conventional scan circuit operates in such a manner that if a pulse signal having a pulse width T (where T is one period of clock signal) is applied as an input signal at the moment the clock signal $\phi$ rises from a low level to a high level, a pulse signal is outputted from a node A at the moment the clock $\bar{\phi}$ rises up. This signal is inputted to the next stage of shift register 21, so that a pulse signal is outputted from a node B at a rising-up timing of the clock $\bar{\phi}$ delayed from the signal of the node A by the period T.

As a result, the pulse signals having the pulse width T are outputted as the (2N-1)th stage and the (2N)th stage (where "N" is positive integer) through the output buffer circuits 30 and 31, respectively.

With a tendency towards large area, long length and high resolution in the liquid display, the close contact image sensor and the like, a scan circuit of 1000 to 6000 stages has become required in a peripheral driving circuit. In the case that the conventional scan circuit shown in FIG. 1 is incorporated in these devices, a delay of the clock signal caused by an increased load capacitance of clock signal lines has become a problem.

For example, the load capacitance of the clock signal lines in the 2000-stage scan circuit in 50 μm pitch standard reaches 500 pF, and the clock signal delay reaches 220 nsec. About 80% of this load capacitance is due to a capacitance in a crossing part of two clock signal lines, and the remaining 20% is a gate capacitance of MOS transistors and an internal wiring capacitance of a circuit.

Therefore, it is difficult to write and read a signal at a speed higher than 4 MHz in the case of using the conventional scan circuit. The circuit malfunctions due to influence of the clock skew. The conventional scan circuit cannot meet the requirements of the liquid crystal display and the close contact image sensor of high speed and high resolution which are expected to be increasingly widely used.

SUMMARY OF THE INVENTION

Accordingly, it is an object of the present invention to provide a scan circuit which has overcome the above mentioned defect of the conventional one.

Another object of the present invention is to provide a scan circuit having a remarkably reduced clock signal delay time, so that it can be used in high speed and high resolution liquid crystal display and close contact image sensor.

The above and other objects of the present invention are achieved in accordance with the present invention by a scan circuit including a plurality of stages of cascaded pulse delay transfer circuits each configured to receive a given pulse signal so as to transfer the received pulse signal at a delayed timing in synchronism with a clock signal, and a plurality of output buffers each having receiving an output of the same stage pulse delay transfer circuit so that respective outputs of the cascaded pulse delay transfer circuits are parallel-outputted through the output buffers, respectively, each of the pulse delay transfer circuits including a single-phase-clock controlled CMOS inverter controlled with only a single-phase-clock.

More specifically, in one preferred embodiment, each of the pulse delay transfer circuits includes, in addition to the above mentioned single-phase-clock controlled CMOS inverter, a logic gate circuit receiving the output of the single-phase-clock controlled CMOS inverter of the same stage and the single-phase-clock applied to the single-phase-clock controlled CMOS inverter of the same stage. Each logic gate circuit outputs a scan signal. A parallel output is constituted of outputs of respective logic gate circuits of the pulse delay transfer circuits.

Alternatively, in another preferred embodiment, each of the pulse delay transfer circuits includes, in addition to the above mentioned single-phase-clock controlled CMOS inverter, a logic gate circuit receiving the output of the single-phase-clock controlled CMOS inverter of the same stage and an output of the single-phase-clock controlled CMOS inverter of a next stage. Each logic gate circuit outputs a scan signal. A parallel output is constituted of outputs of respective logic gate circuits of the pulse delay transfer circuits.

In a still further preferred embodiment, each of the pulse delay transfer circuits is composed of only the above mentioned single-phase-clock controlled CMOS inverter, and the output buffer circuits connected to respective single-phase-clock controlled CMOS inverter are so configured that the output buffer of each odd-numbered stage outputs an inverted output signal, and the output buffer of each even-numbered stage outputs a non-inverted output signal.

The above and other objects, features and advantages of the present invention will be apparent from the following description of preferred embodiments of the invention with reference to the accompanying drawings.

DESCRIPTION OF THE PREFERRED EMBODIMENT

Now, embodiments of the scan circuit in accordance with the present invention will be described with reference to the drawings. The scan circuit in accordance with the present invention is constituted of stages of the number required in accordance with the scale of a display circuit or another circuit to be driven, but for simplification of description, the following embodiments will be described by extracting only two or three stages from the required number of stages.

Figure 4:
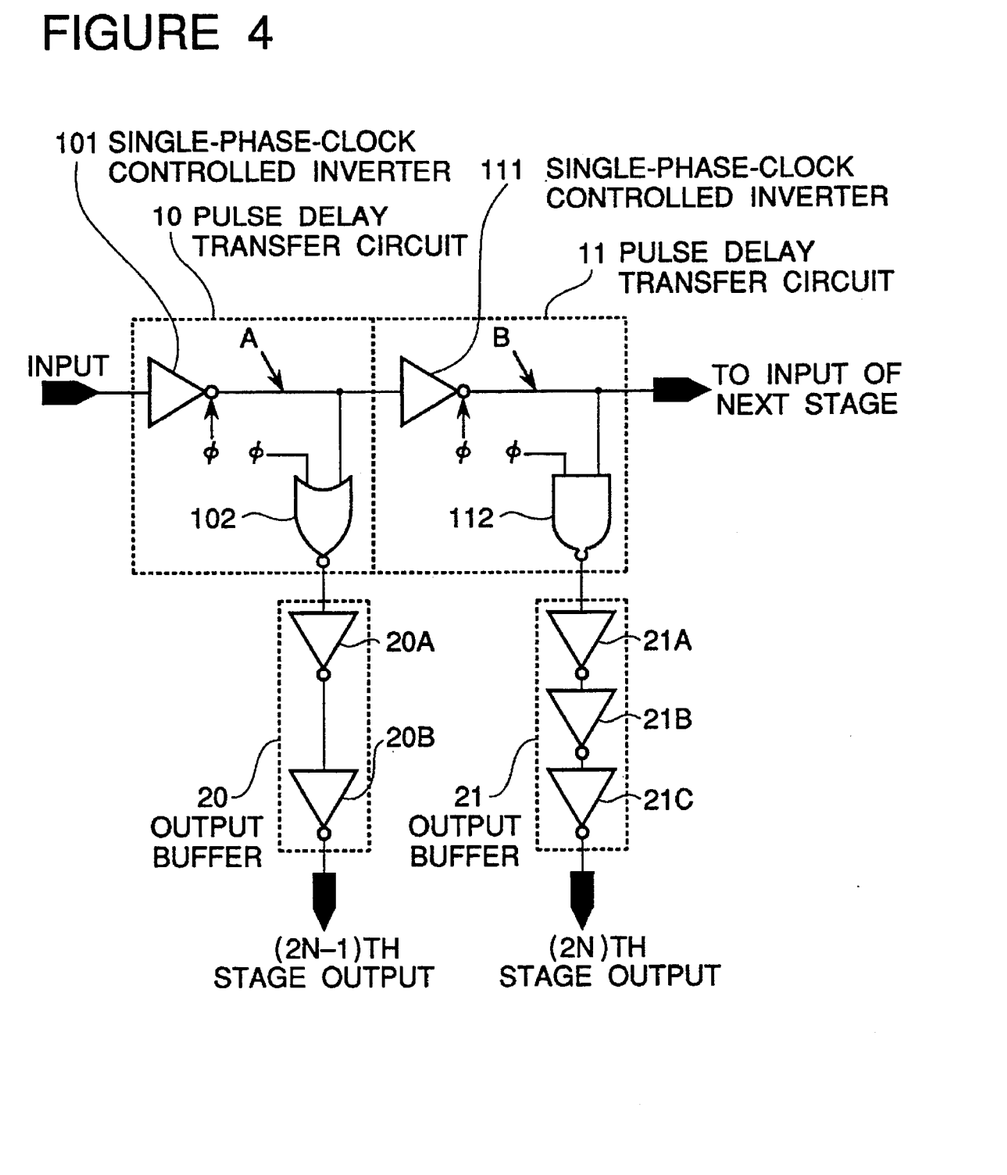
FIG. 4 is a block diagram of a first embodiment of the scan circuit in accordance with the present invention.

Referring to FIG. 4, there is shown a block diagram of a first embodiment of the scan circuit in accordance with the present invention. The shown scan circuit includes pulse delay transfer circuits 10 and 11 connected in cascade, and output buffer circuits 20 and 21 each connected to an output of a corresponding pulse delay transfer circuit. The pulse delay transfer circuits 10 and 11 respectively comprises single-phase-clock controlled inverter 101 and 111, which are connected in cascade, and each of which receives a signal from a preceding stage so as to output the received signal to a next stage at a timing defined by a clock signal $\phi$.

More specifically, an odd-number stage or a (2N-1)th stage (where "N" is positive integer) is constituted of the pulse delay transfer circuit 10 and the output buffer circuit 20 connected to the output of the pulse delay transfer circuit 10. The pulse delay transfer circuit 10 includes a single-phase-clock controlled inverter 101 receiving a signal from a preceding stage (not shown) to output the received signal to a next stage 11 at a delayed timing in synchronism with a clock $\phi$, and a two-input logic gate such as a NOR gate 102 receiving an output of the single-phase-clock controlled inverter 101 and the clock $\phi$. The output buffer circuit 20 is of a non-inverting buffer, which is composed of for example two cascaded inverters 20A and 20B.

An even-number stage or a (2N)th stage is constituted of the pulse delay transfer circuit 11 and the output buffer circuit 21 connected to the output of the pulse delay transfer circuit 11. The pulse delay transfer circuit 11 includes a single-phase-clock controlled inverter 111 receiving a signal from the preceding stage 10 to output the received signal to a next stage (not shown) at a delayed timing in synchronism with the clock $\phi$, and a two-input logic gate such as a NAND gate 112 receiving an output of the single-phase-clock controlled inverter 111 and the clock $\phi$. The output buffer circuit 21 is of an inverting buffer, which is composed of for example three cascaded inverters 21A, 21B and 21C.

Figure 5:
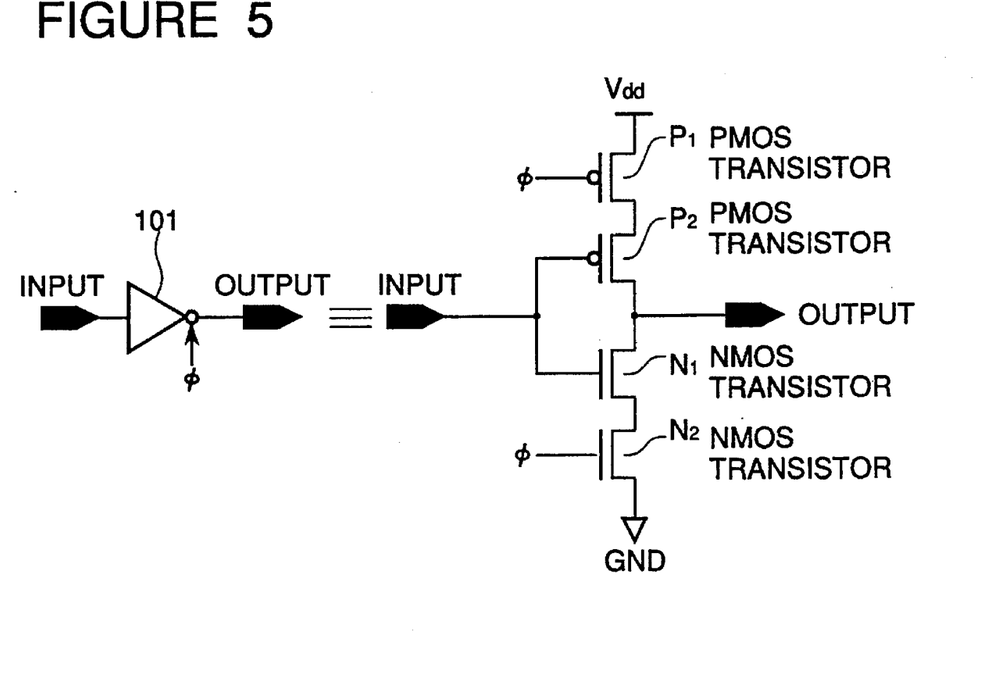
FIG. 5 is a circuit diagram of a single-phase-clock controlled inverter used in the scan circuit in accordance with the present invention.

The single-phase-clock controlled inverters 101 and 111 have the same construction. Referring to FIG. 5, there is shown a circuit diagram of the single-phase-clock controlled inverter 101. The single-phase-clock controlled inverter 101 includes two P-channel MOS transistors P1 and P2 and two N-channel MOS transistors N1 and N2 cascaded between a voltage supply voltage Vdd and ground GND. Gates of the transistors P2 and N1 are connected in common to receive an input signal, and drains of these transistors P2 and N1 are connected in common to generate an output signal. The clock $\phi$ is applied to gates of the transistors P1 and N2.

The above mentioned single-phase-clock controlled inverter is different from the conventional dual-phase-clock controlled inverter mentioned hereinbefore, in that the same clock signal $\phi$ is applied to the gates of the P-channel MOS transistor P1 and the N-channel MOS transistor N2. The pulse delay transfer circuits 10 and 11 are different from the conventional pulse delay transfer circuits 20 and 21 mentioned hereinbefore in that the second dual-phase-clock controlled inverters 202 and 212 are omitted, and the two-input logic gate circuit 102 and 112 synchronized with the clock $\phi$ is inserted between the single-phase-clock controlled inverter 101, 111 and the output buffer 20, 21. In addition, the output buffer of the even-number stage is of the inverting type. With these differences, the output timing is controlled with only one clock $\phi$.

When the clock signal $\phi$ is at a high level, the P-channel MOS transistor P1 having its source connected to the voltage supply voltage Vdd is non-conductive (OFF), while the N-channel MOS transistor N2 having its source connected to the ground is conductive (ON). In this condition, if the input signal is at a high level, the output signal of the single-phase-clock controlled inverter 101 becomes a low level. If the input signal is at a low level, the output signal of the single-phase-clock controlled inverter 101 becomes a high impedance.

To the contrary, when the clock signal ϕ is at a low level, the P-channel MOS transistor P1 having its source connected to the voltage supply voltage Vdd is in an ON condition, while the N-channel MOS transistor N2 having its source connected to the ground is in an OFF condition. In this condition, if the input signal is at a high level, the output signal of the single-phase-clock controlled inverter 101 becomes a high impedance. If the input signal is at a low level, the output signal of the single-phase-clock controlled inverter 101 becomes a high level.

The next stage single-phase-clock controlled inverter 111 operates similarly.

Furthermore, each of the inverters 20A, 20B, 21A, 21B and 21C are formed of a CMOS inverter, which can be formed of only the PMOS transistors P2 and the NMOS transistor N1 by omitting the PMOS transistors P1 and the NMOS transistor N2 in FIG. 5. In addition, the other logic gate circuit including the NOR gate circuit 102 and the NAND gate circuit 112 are also formed of MOS transistors. Therefore, the overall scan circuit is constituted of MOS transistors.

Figure 6:
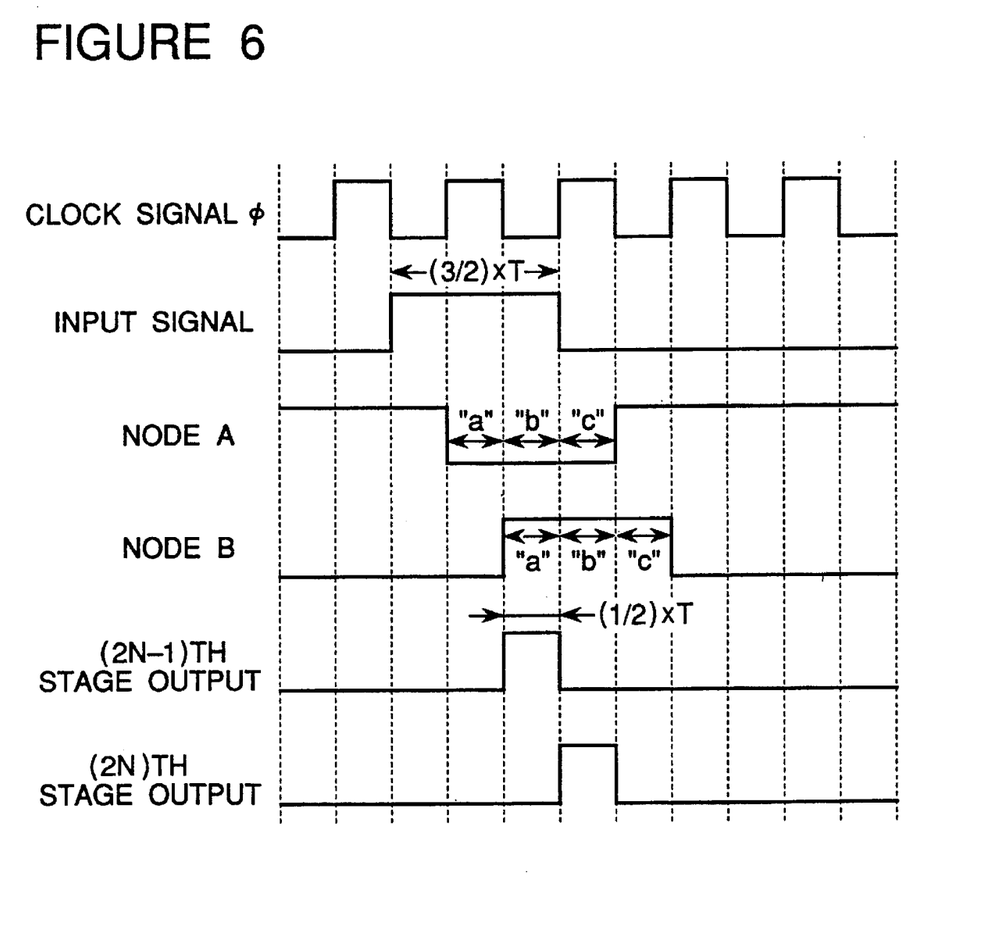
FIG. 6 is a timing chart illustrating an operation of the first embodiment of the scan circuit in accordance with the present invention.

Referring to FIG. 6, there is shown a timing chart illustrating an operation of the scan circuit of the first embodiment. If a pulse signal having a pulse width of $(3/2) \times T$ (where T is one period of clock signal) is applied as an input signal to the pulse delay transfer circuit 10 at the moment the clock signal ϕ falls down from a high level to a low level, a negative-going pulse is outputted from a node A (the output of the single-phase-clock controlled inverter 101) at a rising timing of the clock. This negative-going pulse is applied as the input signal to the single-phase-clock controlled inverter 111 of the next stage pulse delay transfer circuit 11, and therefore, a positive-going signal is outputted from the node B (the output of the single-phase-clock controlled inverter 111) at a timing which is delayed from the timing of the negative-going signal on the node A by a period of $(1/2) \times T$ and which is in synchronism with the falling of the clock ϕ.

In periods labelled "b" and "c" in the waveform diagram of the pulse signal on the nodes A and B shown in FIG. 6, the respective outputs of the single-phase-clock controlled inverters 101 and 111 are in a high impedance condition. However, the voltage during a preceding period "a" is still held during the periods "b" and "c" because of a gate capacitance of MOS transistors of the respective next stage single-phase-clock controlled inverters and the logic gate circuits 102 and 112.

During the period "a", the outputs of the single-phase-clock controlled inverters 101 and 111 are in a low impedance condition. When both of the pulse on the node A and the clock ϕ become a low level, the output of the NOR gate 102 becomes a high level, so that the scan pulse is outputted from the (2N-1)th stage through the non-inverting output buffer 20 at a timing that the clock signal ϕ is brought from the high level to the low level.

Then, when both of the pulse on the node B and the clock ϕ become a high level, the output of the NAND gate 112 become a low level, so that the scan pulse is outputted from the (2N)th stage through the inverting output buffer 21 at a timing delayed from the scan pulse signal of the (2N-1)th stage by a period of $(1/2) \times T$.

Thus, the scan pulses can be generated with the single-phase-clock signal ϕ.

In the above mentioned embodiment, the input signal is set to have the period of $(3/2) \times T$ (where T is one period of the clock signal ϕ). However, the input signal may be set to have the period of T, so that it is inputted as the rising timing of the clock signal ϕ.

By using the scan circuit structure of this first embodiment, a 50 μm pitch, 2000 stage scan circuit formed of polysilicon thin film transistors was manufactured on a glass plate. As a result, the load capacitance of the clock signal lines was about 200 pF in and therefore was reduced by about 60% in comparison with 500 pF in the conventional example. In this example, the clock signal delay time was not more than 100 nsec. Accordingly, it is possible to meet with the devices such as a high-speed, high-resolution, liquid crystal display and close contact image sensor having the signal writing and reading speed of 4 MHz or more. In addition, since the scan circuit is driven with the single-phase-clock, it is free from malfunction caused of a clock skew.

Figure 7:
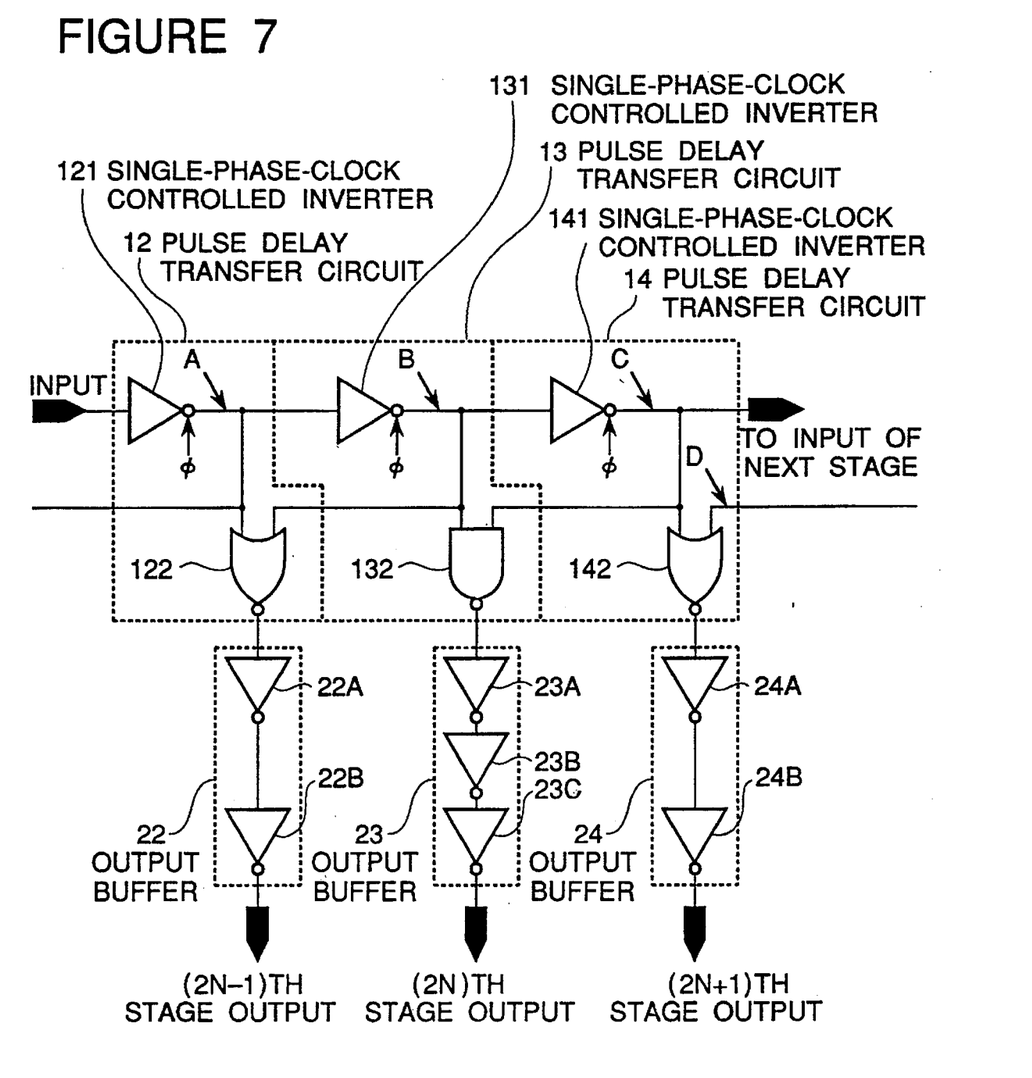
FIG. 7 is a block diagram of a second embodiment of the scan circuit in accordance with the present invention.

Referring to FIG. 7, there is shown a block diagram of a second embodiment of the scan circuit in accordance with the present invention.

This second embodiment of the scan circuit comprises pulse delay transfer circuits 12 to 14 and output buffer circuits 22 to 24. The pulse delay transfer circuits 12 to 14 respectively comprise a single-phase-clock controlled inverter 121, 131 and 141 and a two-input logic gate circuit receiving an output of an associated single-phase-clock controlled inverter and an output of a next stage single-phase-clock controlled inverter. The two-input logic gate circuit is formed of a NOR gate 122 and 142 in an odd-numbered stage and of a NAND gate 132 in an even-numbered stage. Outputs of these logic gate circuits are connected to output buffers 22, 23 and 24, respectively, Which output respective scan signals. The output buffer is of a non-inverting buffer 22 and 24 (formed of for example two cascaded inverters 22A and 22B or 24A and 24B) in the odd-numbered stage and of an inverting buffer 23 (formed of for example three cascaded inverters 23A, 23B and 23C) in the even-numbered stage.

The second embodiment is different from the first embodiment in that each of the two-input logic gate circuits 122, 132 and 142 receives the output of the next stage single-phase-clock controlled inverter, in place of the clock signal ϕ.

With this arrangement, the second embodiment can reduce the load capacitance of the clock signal lines, by the gate capacitance of MOS transistors constituting the logic gates, in comparison with the first embodiment.

Figure 8:
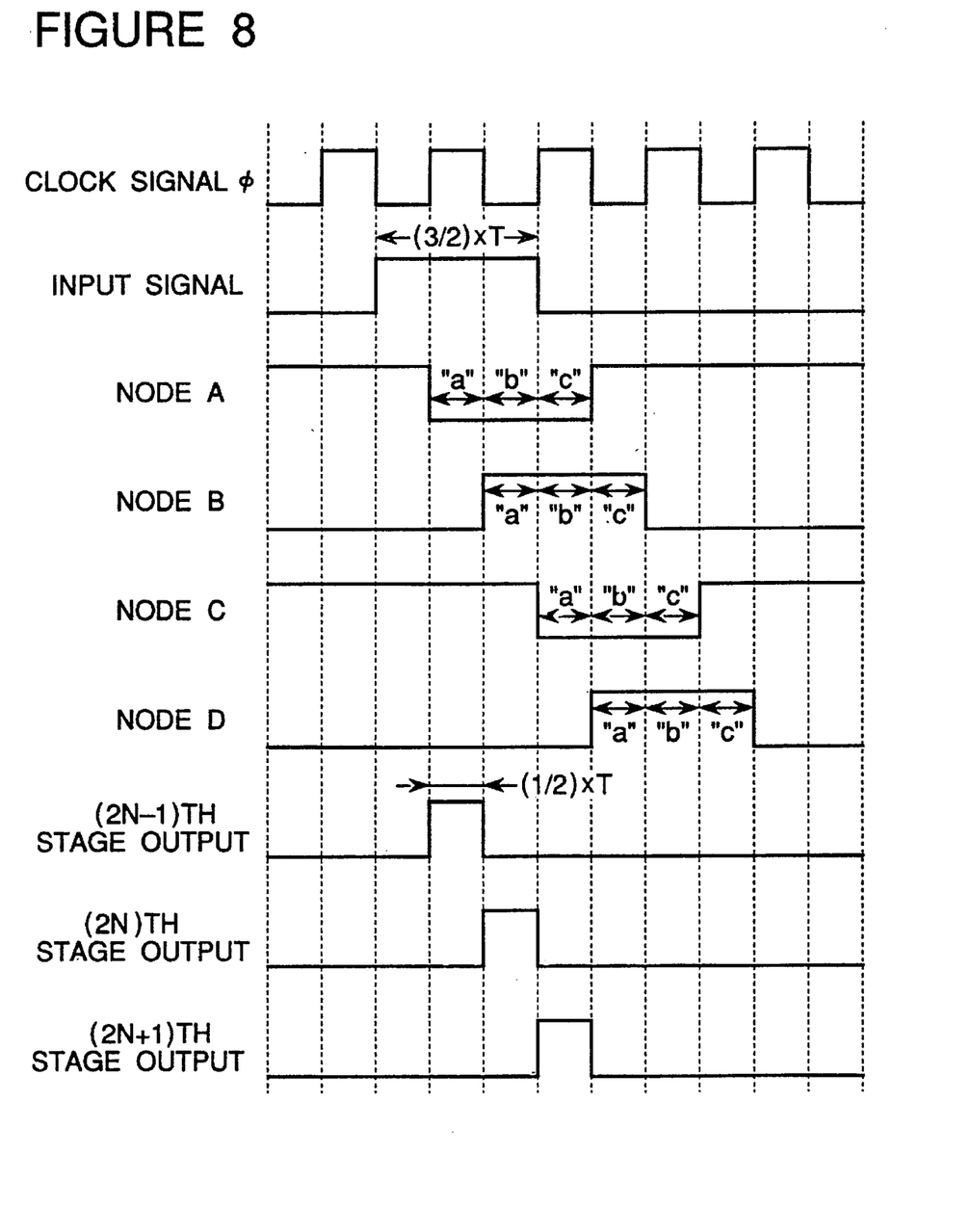
FIG. 8 is a timing chart illustrating an operation of the second embodiment of the scan circuit in accordance with the present invention.

Referring to FIG. 8, there is shown a timing chart illustrating an operation of the second embodiment of the scan circuit in accordance with the present invention. A pulse signal having a pulse width of $(3/2) \times T$ is applied as an input signal of the single-phase-clock controlled inverter 121 of the (2N-1)th stage 12 at the falling-down timing of the clock signal ϕ, and a negative-going pulse signal is outputted from a node A (the output of the single-phase-clock controlled inverter 121) at a rising timing of the clock ϕ. This negative-going pulse signal is applied as the input signal to the single-phase-clock controlled inverter 131 of the next stage, namely the (2N)th stage 13, and therefore, a positive-going pulse signal is outputted from the node B (the output of the single-phase-clock controlled inverter 131) at a falling-down timing of the clock ϕ which is delayed from the timing of the negative-going pulse signal on the node A by a period of $(1/2) \times T$. This positive-going pulse signal is also applied as the input signal to the single-phase-clock controlled inverter 141 of the next stage, namely the (2N+1)th stage 14, and therefore, a negative-going pulse signal signal is outputted from the node C (the output of the single-phase-clock controlled inverter 141) at a rising-up timing of the clock $\phi$ which is delayed from the timing of the positive-going pulse signal on the node B by a period of $(1/2) \times T$.

In periods labelled "b" and "c" in the waveform diagram of the pulse signal on the nodes A, B and C shown in FIG. 8, the respective outputs of the single-phase-clock controlled inverters 121, 131 and 141 are in a high impedance condition. However, as mentioned above, the voltage during a preceding period "a" is still held during the periods "b" and "c" because of the capacitance of MOS transistors of the respective next stage single-phase-clock controlled inverters and the associated logic gate circuits 122, 132 and 142. During the period "a", the outputs of the single-phase-clock controlled inverters 121, 131 and 141 are in a low impedance condition.

When both of the pulses on the nodes A and B become a low level, the output of the NOR gate 122 of the (2N-1)th stage becomes a high level, so that the scan pulse is outputted from the (2N-1)th stage through the non-inverting output buffer 22 at the rising-up timing of the clock signal $\phi$ which is delayed form the input signal by a period of $(1/2) \times T$.

When both of the pulses on the nodes B and C become a high level, the output of the NAND gate 132 of the (2N)th stage becomes a low level, so that the scan pulse is outputted from the (2N)th stages through the inverting output buffer 23 at a timing delayed from the scan pulse signal of the (2N-1)th stage by a period of $(1/2) \times T$.

When both of the pulses on the nodes C and D become a low level, the output of the NOR gate 142 of the (2N+1)th stage becomes a high level, so that the scan pulse is outputted from the (2N+1)th stage through the non-inverting output buffer 24 at a timing delayed from the scan pulse signal of the (2N)th stage by a period of $(1/2) \times T$.

Thus, the scan pulses can be generated with the single-phase-clock signal $\phi$.

By using the scan circuit structure of this second embodiment, a 50 µm pitch, 2000 stage scan circuit formed of polysilicon thin film transistors were manufactured on a glass plate. As a result, the load capacitance of the clock signal lines was about 100 pF in and therefore was reduced by about 80% in comparison with 500 pF in the conventional example. In this example, the clock signal delay time was not more than 50 nsec. Accordingly, it is possible to meet the requirements of the devices such as a high-speed, high-resolution, liquid crystal display and close contact image sensor having the signal writing and reading speed of 8 MHz or more. In addition, since the scan circuit is driven with the single-phase-clock similarly to the first embodiment, it is free from malfunction caused of a clock skew.

Figure 9:
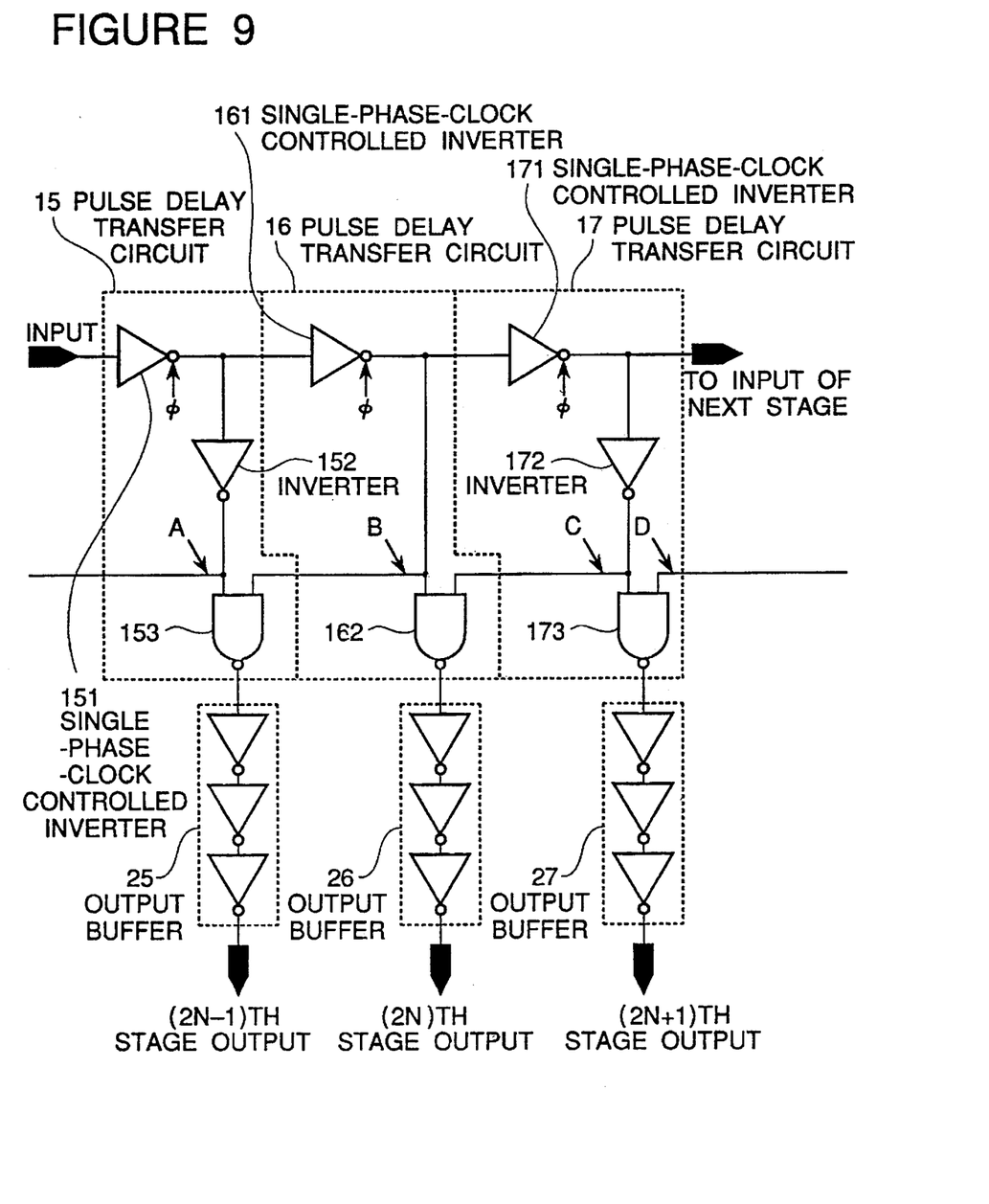
FIG. 9 is a block diagram of a third embodiment of the scan circuit in accordance with the present invention.

Referring to FIG. 9, there is shown a block diagram of a third embodiment of the scan circuit in accordance with the present invention.

This third embodiment of the scan circuit comprises cascaded pulse delay transfer circuits 15, 16 and 17 and output buffer circuits 25, 26 and 27 each associated with a corresponding pulse delay transfer circuit. The pulse delay transfer circuits 15, 16 and 17 respectively comprise a single-phase-clock controlled inverter 151, 161 and 171 which are connected in cascade, and a two-input NAND gate circuit 152, 162 and 173 having a first input receiving an output of the single-phase-clock controlled inverter of the same stage through an inverter 152 and 172 in an odd-numbered stage or directly in an even-numbered stage. A second input of these two-input NAND gate circuit 152, 162 and 173 receives an output of a next stage single-phase-clock controlled inverter. Outputs of these NAND gate circuits are connected to output buffers 25, 26 and 27, respectively, which output respective scan signals, and which are formed of an inverting buffer (formed of for example three cascaded inverters).

The third embodiment is different from the second embodiment in that the output of the single-phase-clock controlled inverters 151 and 171 in the odd-numbered stage is connected through the inverter 152 and 172 to the logic gate circuits 153 and 173, respectively, and all these logic gate circuits 153, 162 and 173 are formed of a NAND gate regardless of whether it is in the odd-numbered stage or in the even-numbered stage, and also, all the output buffers 25, 26 and 27 are formed of the inverting buffer.

With the above mentioned arrangement, symmetry between the odd-numbered stage and the even-numbered stage can be improved, and therefore, it becomes easy to make the rising or falling time of the scan pulse signals of the odd-numbered and even-numbered stages the same values.

Figure 10:
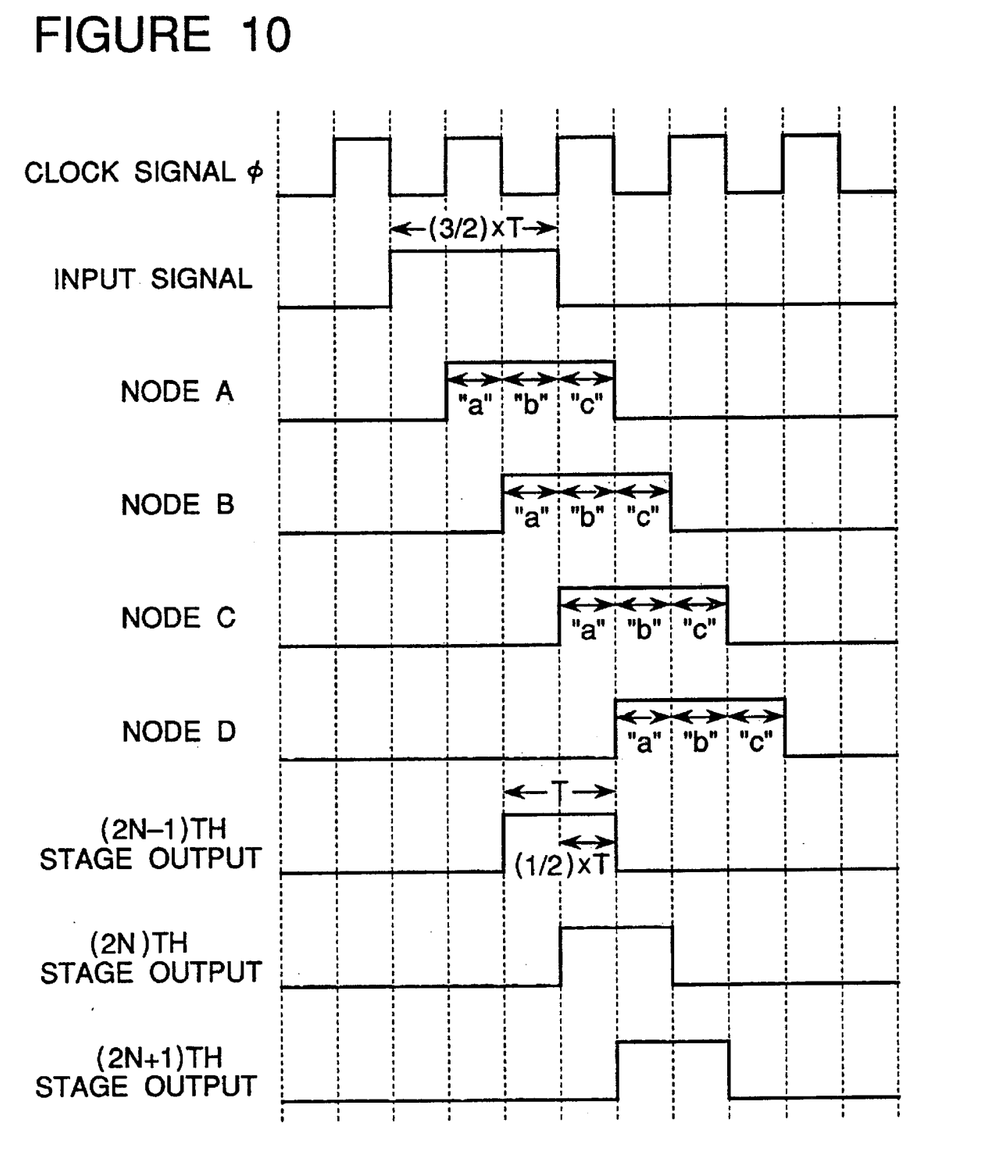
FIG. 10 is a timing chart illustrating an operation of the third embodiment of the scan circuit in accordance with the present invention.

Referring to FIG. 10, there is shown a timing chart illustrating an operation of the third embodiment of the scan circuit in accordance with the present invention. If a pulse signal having a pulse width of $(3/2) \times T$ is applied as an input signal to the single-phase-clock controlled inverter 151 at the falling-down timing of the clock signal $\phi$, a positive-going pulse signal is outputted from a node A (the output of the inverter 152) at a rising timing of the clock $\phi$. This positive-going pulse signal is applied as the input signal to the single-phase-clock controlled inverter 161 of the next stage, namely the (2N)th stage pulse delay transfer circuit 16, and therefore, a positive-going pulse signal is outputted from the node B (the output of the single-phase-clock controlled inverter 161) at a falling-down timing of the clock $\phi$ which is delayed from the timing of the positive-going pulse signal on the node A by a period of $(1/2) \times T$.

This positive-going clock signal is also applied as the input signal to the single-phase-clock controlled inverter 171 of the next stage, namely the (2N+1)th stage pulse delay, transfer circuit 17, and therefore, a positive-going pulse signal is outputted from the node C (the output of the inverter 172) at a rising-up timing of the clock $\phi$ which is delayed from the timing of the positive-going pulse signal on the node B by a period of $(1/2) \times T$.

In periods labelled "b" and "c" in the waveform diagram of the pulse signal on the nodes A, B and C shown in FIG. 10, the respective outputs of the single-phase-clock controlled inverters 151, 161 and 171 are in a high impedance condition. However, as mentioned above, the voltage during a preceding period "a" is still held during the periods "b" and "c" because of the gate capacitance of MOS transistors of the respective next stage single-phase-clock controlled inverters and the logic gate circuit 162 and the inverters 152 and 172.

During the period "a", the outputs of the single-phase-clock controlled inverters 151, 161 and 171 are in a low impedance condition.

When both of the pulses on the nodes A and B become a high level, the output of the NAND gate 153 of the (2N-1)th stage become a low level, so that the scan pulse signal having the pulse width "T" is outputted from the (2N-1)th stage through the inverting output buffer 25 at the falling-down timing of the clock signal φ which is delayed form the input signal by a period "T".

When both of the pulses on the nodes B and C become a high level, the output of the NAND gate 162 of the (2N)th stage becomes a low level, so that the scan pulse signal having the pulse width "T" is outputted from the (2N)th stage through the inverting output buffer 26 at a timing delayed from the scan pulse signal of the (2N-1)th stage by a period of (1/2)×T.

When both of the pulses on the nodes C and D become a high level, the output of the NAND gate 173 of the (2N+1)th stage becomes a low level, so that the scan pulse signal having the pulse width "T" is outputted from the (2N+1)th stage through the inverting output buffer 27 at a timing delayed from the scan pulse signal of the (2N)th stage by a period of (1/2)×T.

Thus, the scan pulses can be generated with the single-phase-clock signal φ.

By using the scan circuit structure of this third embodiment, a 50 μm pitch, 2000 stage scan circuit formed of polysilicon thin film transistors was manufactured on a glass plate. The clock signal delay time could be suppressed at the same degree as that obtained in the second embodiment. Accordingly, it is possible to meet the requirements of the devices such as a high-speed, high-resolution, liquid crystal display and close contact image sensor having the signal writing and reading speed of 8 MHz or more. In addition, since the scan circuit is driven with the single-phase-clock similarly to the first and second embodiments, it is free from malfunction caused of a clock skew.

Figure 11:
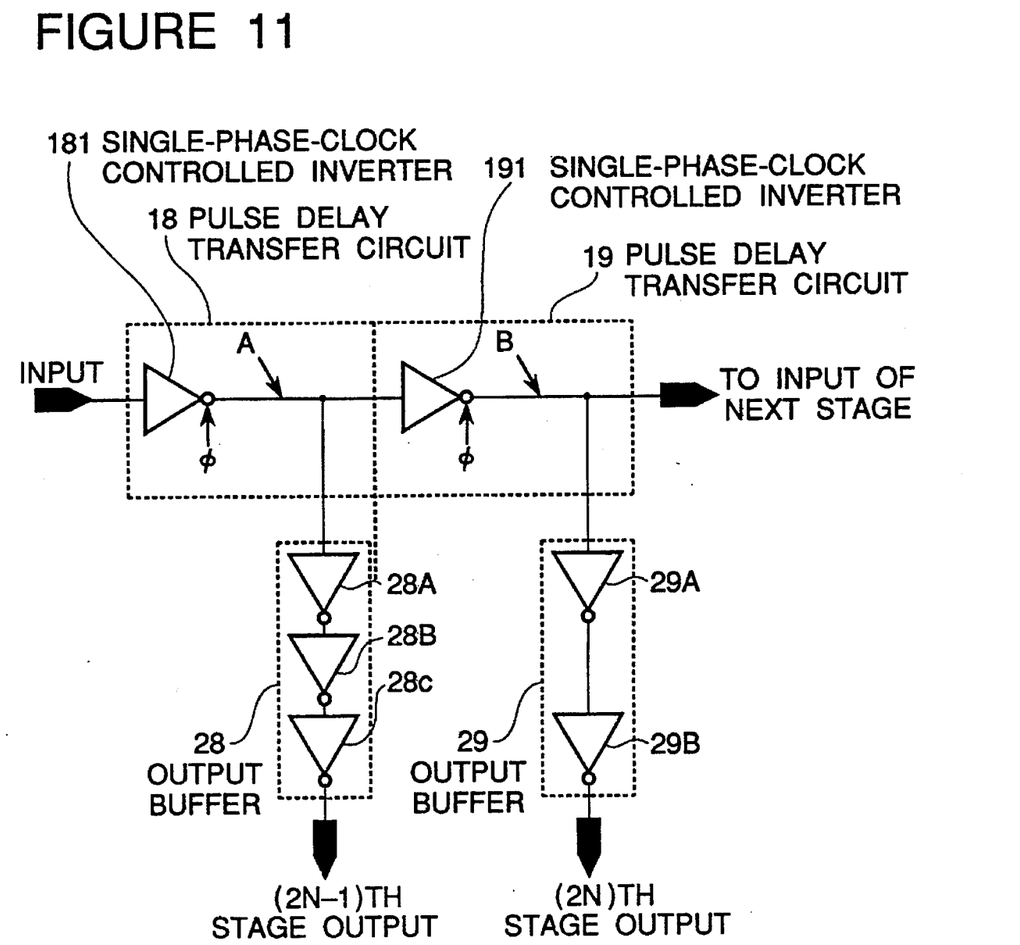
FIG. 11 is a block diagram of a fourth embodiment of the scan circuit in accordance with the present invention.

Referring to FIG. 11, there is shown a block diagram of a fourth embodiment of the scan circuit in accordance with the present invention.

This fourth embodiment includes pulse delay transfer circuits 18 and 19 connected in cascade and output buffer circuits 28 and 29 associated with the pulse delay transfer circuits 18 and 19, respectively. The pulse delay transfer circuits 18 and 19 respectively comprise only single-phase-clock controlled inverters 181 and 191, which are connected in cascade, and each of which receives a signal from a preceding stage so as to output the received signal to a next stage at a timing defined by a clock signal φ. Respective outputs of the single-phase-clock controlled inverter 181 and 191 are connected to the output buffer circuits 28 and 29, respectively, which are of the inverting buffer (formed of for example, three cascaded inverters 28A, 28B and 28C) in an odd-numbered or (2N-1)th stage and of the non-inverting buffer (formed of for example, two cascaded inverters 29A and 28B) in an even-numbered or (2N)th stage.

The fourth embodiment is different from the first to third embodiments in that the overall circuit is simplified by deleting the logic gate circuits which were provided in the pulse delay transfer circuits of the first to third embodiments.

Figure 12:
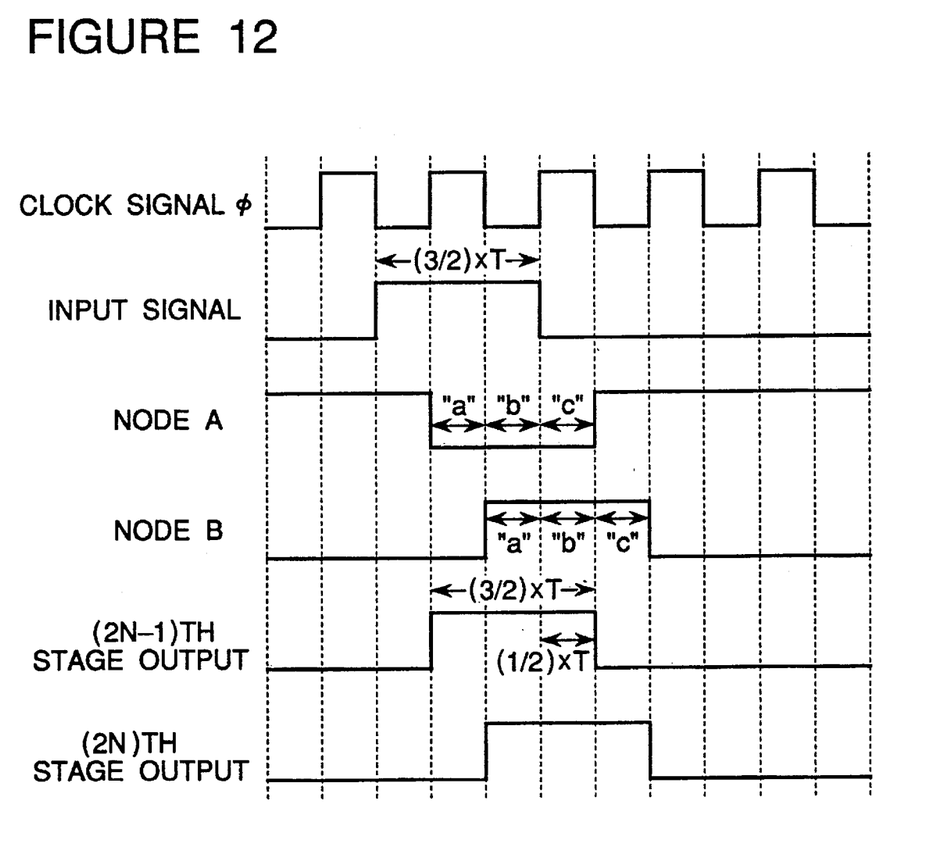
FIG. 12 is a timing chart illustrating an operation of the fourth embodiment of the scan circuit in accordance with the present invention.

Referring to FIG. 12, there is shown a timing chart illustrating an operation of the fourth embodiment of the scan circuit in accordance with the present invention.

If a pulse signal, having a pulse width of (3/2)×T is applied as an input signal to the single-phase-clock controlled inverter 181 at the falling-down timing of the clock signal φ, a negative-going pulse signal is outputted from a node A (the output of the single-phase-clock controlled inverter 181) at a rising-up timing of the clock φ. This negative-going pulse signal is applied as the input signal to the single-phase-clock controlled inverter 191 of the next stage pie delay transfer circuit 19, and therefore, a positive-going pulse signal is outputted from the node B (the output of the single-phase-clock controlled inverter 191) at a timing which is delayed from the timing of the negative-going pulse signal on the node A by a period of (1/2)×T and which is in synchronism with the falling-down of the clock φ.

In periods labelled "b" and "c" in the waveform diagram of the pulse signal on the nodes A and B shown in FIG. 12, the respective outputs of the single-phase-clock controlled inverters 181 and 191 are in a high impedance condition. However, the voltage during a preceding period "a" is still held during the periods "b" and "c" because of a gate capacitance of a MOS transistor of the respective next stage single-phase-clock controlled inverters and the output buffers 28 and 29. During the period "a", the outputs of the single-phase-clock controlled inverters 181 and 191 are in a low impedance condition.

Thus, the pulse signal on the node A is outputted through the inverting output buffer 28 as the scan signal of the (2N-1)th stage at a timing which is delayed from the input pulse signal by a period of (1/2)×T. The pulse signal on the node B is outputted through the non-inverting output buffer 29 as the scan signal of the (2N)th stage at a timing which is delayed from the scan pulse signal of the (2N-1)th stage by a period of (1/2)×T.

Thus, the scan pulse signals having a pulse width of (3/2)×T can be generated with the single-phase-clock signal φ.

By using the scan circuit structure of this fourth embodiment, a 50 μm pitch, 2000 stage scan circuit formed of polysilicon thin film transistors was manufactured on a glass plate. The clock signal delay time could be suppressed at the same degree as that obtained in the second and third embodiments. Accordingly, it is possible m meet with the devices such as a high-speed, high-resolution, liquid crystal display and close contact image sensor having the signal writing and reading speed of 8 MHz or more. In addition, since the scan circuit is driven with the single-phase-clock similarly to the first and second embodiments, it is free from malfunction caused of a clock skew.

In the first to fourth embodiments, the scan circuits have been formed of a CMOS dynamic circuit, but it is a matter of course that the scan circuits can be formed of a CMOS static circuit. In addition, in the above mentioned embodiments, the polysilicon thin film transistors have been used, but it is possible to use other thin film transistors including a semiconductor layer formed of an amorphous silicon or a cadmium selenium. Furthermore, it is also a matter of course that the circuit can be formed of single crystal silicon MOS transistors.

The invention has thus been shown and described with reference to the specific embodiments. However, it should be noted that the present invention is in no way limited to the details of the illustrated structures but changes and modifications may be made within the scope of the appended claims.

I claim:

1. A scan circuit including:
   a plurality of stages of cascaded pulse delay transfer circuits, a first stage of said plurality of stages receiving an input pulse signal and outputting to a subsequent stage a given pulse signal, each subsequent stage of said plurality of stages for receiving a given pulse signal from a respective preceding stage, so as to transfer the received pulse signal at a delayed timing in synchronism with a clock signal; and a corresponding number of output buffers each for receiving an output of the pulse delay transfer circuit of a corresponding stage so that respective outputs of said cascaded pulse delay transfer circuits are parallel-outputted through said output buffers, respectively, each of said pulse delay transfer circuits including a single-phase-clock-controlled complementary-metal-oxide-semiconducting (CMOS) inverter controlled with only a single-phase-clock, wherein said single-phase-clock-controlled inverter includes first and second P-channel insulated gate transistors and first and second N-channel insulated gate transistors cascaded between a voltage supply voltage and ground, gates of said second P-channel insulated gate transistors and said first N-channel insulated gate transistors being connected in common to receive said given pulse signal, and drains of said second P-channel insulated gate transistors and said first N-channel insulated gate transistors being connected in common to generate an output signal, gates of said first P-channel insulated gate transistors and said second N-channel insulated gate transistors being connected to receive the same single-phase-clock.

2. A scan circuit including:

a plurality of stages of cascaded pulse delay transfer circuits, a first stage of said plurality of stages receiving an input pulse signal and outputting to a subsequent stage a given pulse signal, each subsequent stage of said plurality of stages for receiving a given pulse signal from a respective preceding stage, so as to transfer the received pulse signal at a delayed timing in synchronism with a clock signal; and a corresponding number of output buffers each for receiving an output of the pulse delay transfer circuit of a corresponding stage so that respective outputs of said cascaded pulse delay transfer circuits are parallel-outputted through said output buffers, respectively, each of said pulse delay transfer circuits including a single-phase-clock-controlled complementary-metal-oxide-semiconducting (CMOS) inverter controlled with only a single-phase-clock, and a logic gate circuit for receiving the output of the single-phase-clock-controlled CMOS inverter of the same stage and said single-phase-clock applied to the single-phase-clock-controlled CMOS inverter of the same stage, outputs of respective logic gate circuits of the pulse delay transfer circuits being outputted in parallel to one another to respective output buffers of corresponding stages, wherein said single-phase-clock-controlled inverter includes first and second P-channel insulated gate transistors and first and second N-channel insulated gate transistors cascaded between a voltage supply voltage and ground, gates of said second P-channel insulated gate transistors and said first N-channel insulated gate transistors being connected in common to receive said given pulse signal, and drains of said second P-channel insulated gate transistors and said first N-channel insulated gate transistors being connected in common to generate an output signal, gates of said first P-channel insulated gate transistors and said second N-channel insulated gate transistors being connected to receive the same single-phase-clock.

3. A scan circuit claimed in claim 2, wherein said logic gate circuit comprises a NOR gate in an odd-numbered stage and a NAND gate in an even-numbered stage, and wherein said output buffer having an input connected to an output of said NOR gate generates a non-inverted output and said output buffer having an input connected to an output of said NAND gate generates an inverted output.

4. A scan circuit including:

a plurality of stages of cascaded pulse delay transfer circuits, a first stage of said plurality of stages receiving an input pulse signal and outputting to a subsequent stage a given pulse signal, each subsequent stage of said plurality of stages for receiving a given pulse signal from a respective preceding stage, so as to transfer the received pulse signal at a delayed timing in synchronism with a clock signal; and a corresponding number of output buffers each for receiving an output of the pulse delay transfer circuit of a corresponding stage so that respective outputs of said cascaded pulse delay transfer circuits are parallel-outputted through said output buffers, respectively, each of said pulse delay transfer circuits including a single-phase-clock-controlled complementary-metal-oxide-semiconducting (CMOS) inverter controlled with only a single-phase-clock, and a logic gate circuit for receiving an output of the single-phase-clock-controlled CMOS inverter of the same stage and an output of the single-phase-clock-controlled CMOS inverter of a next stage, each said logic gate circuit outputting a scan signal, outputs of respective logic gate circuits of the pulse delay transfer circuits being outputted in parallel to one another to respective ones of said output buffers, wherein said single-phase-clock-controlled inverter includes first and second P-channel insulated gate transistors and first and second N-channel insulated gate transistors cascaded between a voltage supply voltage and ground, gates of said second P-channel insulated gate transistors and said first N-channel insulated gate transistors being connected in common to receive said given pulse signal, and drains of said second P-channel insulated gate transistors and said first N-channel insulated gate transistors being connected in common to generate an output signal, gates of said first P-channel insulated gate transistors and said second N-channel insulated gate transistors being connected to receive the same single-phase-clock.

5. A scan circuit claimed in claim 4, wherein said logic gate circuit comprises a NOR gate in an odd-numbered stage and a NAND gate in an even-numbered stage, and wherein said output buffer having an input connected to an output of said NOR gate generates a non-inverted output and said output buffer having an input connected to an output of said NAND gate generates an inverted output.

6. A scan circuit claimed in claim 4, wherein said logic gate circuit comprises a NAND gate, said NAND gate in an odd-numbered stage having a first input connected through an inverter to said output of the single-phase-clock controlled CMOS inverter of the same stage and a second input connected directly to said output of the single-phase-clock controlled CMOS inverter of said next stage, and said NAND gate in an even-numbered stage having a first input connected directly to said output of the single-phase-clock controlled CMOS inverter of the same stage and a second input connected through an inverter to said output of the single-phase-clock controlled CMOS inverter of said next stage, and wherein said output buffer comprises an inverting buffer for generating an inverted signal of an output of said NAND gate of the same stage.

7. A scan circuit claimed in claim 1, wherein each of said pulse delay transfer circuits comprises only said single-phase-clock-controlled CMOS inverter, and wherein said output buffer circuit connected to said single-phase-clock-controlled CMOS inverter in an odd-numbered stage outputs an inverted output signal, and wherein said output buffer circuit connected to said single-phase-clock-controlled CMOS inverter in an even-numbered stage outputs a non-inverted output signal.

8. A scan circuit according to claim 1, wherein each of said pulse delay transfer circuits includes a logic gate circuit for receiving an output of the single-phase-clock-controlled CMOS inverter of the same stage and said single-phase-clock applied to the single-phase-clock-controlled CMOS inverter of the same stage.

9. A scan circuit according to claim 8, wherein said logic gate circuit comprises a NOR gate in an odd-numbered stage, and wherein said output buffer having an input connected to an output of said NOR gate generates a non-inverted output.

10. A scan circuit according to claim 8, wherein said logic gate circuit comprises a NAND gate in an even-numbered stage, and wherein said output buffer having an input connected to an output of said NAND gate generates an inverted output.

11. A scan circuit according to claim 1, wherein each of said pulse delay transfer circuits includes a logic gate circuit for receiving the output of the single-phase-clock-controlled CMOS inverter of the same stage.

12. A scan circuit according to claim 11, wherein each logic gate circuit receives the output of the single-phase-clock-controlled CMOS inverter of a next stage, and outputs a scan signal, outputs of respective logic gate circuits of the pulse delay transfer circuits being outputted in parallel to one another.

13. A scan circuit according to claim 11, wherein said logic gate circuit comprises a NOR gate in an odd-numbered stage, wherein said output buffer having an input connected an output of said NOR gate generates a non-inverted output.

14. A scan circuit according to claim 11, wherein said logic gate circuit comprises a NAND gate in an even-numbered stage, and wherein said output buffer having an input connected to an output of said NAND gate generates an inverted output.

15. A scan circuit according to claim 11, wherein said logic gate circuit comprises a NAND gate, said NAND gate in an odd-numbered stage having a first input connected through an inverter to said output of the single-phase-clock-controlled CMOS inverter of the same stage.

16. A scan circuit according to claim 1, wherein a clock signal applied to said single-phase-clock-controlled CMOS inverter is a same single clock signal and is the same for all stages of said plurality of stages.

17. A scan circuit according to claim 1, wherein an output of said first stage of said plurality of stages has a same pulse width as that of a second stage of said plurality of stages.

18. A scan circuit according to claim 2, wherein an output of said first stage of said plurality of stages has a same pulse width as that of a second stage of said plurality of stages.

19. A scan circuit according to claim 4, wherein an output of said first stage of said plurality of stages has a same pulse width as that of a second stage of said plurality of stages.

* * * * *